(12) United States Patent
Wang et al.

(10) Patent No.: US 11,996,505 B2
(45) Date of Patent: May 28, 2024

(54) VACUUM INJECTION MOLDING FOR OPTOELECTRONIC MODULES

(71) Applicant: ams Sensors Singapore Pte. Ltd., Singapore (SG)

(72) Inventors: Ji Wang, Singapore (SG); Kam Wah Leong, Singapore (SG); QiChuan Yu, Singapore (SG); Simon Gubser, Weesen (CH); Yoong Kheng Teoh, Singapore (SG)

(73) Assignee: AMS Sensors Singapore PTE. LTD., Singapore (SG)

( * ) Notice: Subject to any disclaimer, the term of this patent is extended or adjusted under 35 U.S.C. 154(b) by 471 days.

(21) Appl. No.: 17/294,749

(22) PCT Filed: Nov. 27, 2019

(86) PCT No.: PCT/SG2019/050580
§ 371 (c)(1),
(2) Date: May 18, 2021

(87) PCT Pub. No.: WO2020/122813
PCT Pub. Date: Jun. 18, 2020

(65) Prior Publication Data
US 2022/0020901 A1    Jan. 20, 2022

Related U.S. Application Data

(60) Provisional application No. 62/777,407, filed on Dec. 10, 2018.

(51) Int. Cl.
*B29C 45/34* (2006.01)
*B29C 33/12* (2006.01)
(Continued)

(52) U.S. Cl.
CPC .............. *H01L 33/56* (2013.01); *B29C 33/12* (2013.01); *B29D 11/00307* (2013.01);
(Continued)

(58) Field of Classification Search
CPC ...... B29C 2045/0075; B29C 45/14065; B29C 2045/14114; B29C 45/14639;
(Continued)

(56) References Cited

U.S. PATENT DOCUMENTS 5,032,426 A * 7/1991 Sumner, Jr. .......... H05K 3/0091
427/372.2
6,342,670 B1   1/2002 Lin
(Continued)

FOREIGN PATENT DOCUMENTS

CN    102201383 A    9/2011
CN    104937445 A    9/2015
(Continued)

OTHER PUBLICATIONS

Office Action for corresponding Chinese patent applicaiton No. 201980081786, dated Dec. 20, 2022, 7 pages (for informational purposes only).
(Continued)

*Primary Examiner* — Leo B Tentoni
(74) *Attorney, Agent, or Firm* — Viering, Jentschura & Partner mbB; Benjamin L. von Rueden

(57) ABSTRACT

Manufacturing optoelectronic modules includes supporting a printed circuit board substrate (27) on a first vacuum injection tool (24). The printed circuit board substrate (27) has at least one optoelectronic component mounted thereon and has a solder mask (40) on a surface (46) facing away from the first vacuum injection tool (24). The method includes causing the first vacuum injection tool (24) and a second vacuum injection tool (22) to be brought closer to
(Continued)

one another such that a surface (46) of the second vacuum injection tool (22) is in contact with the solder mask (40). Subsequently, a first epoxy (100, 20) is provided, using a vacuum injection technique, in spaces (104) between the upper tool (22) and the solder mask (40).

19 Claims, 7 Drawing Sheets

(51) Int. Cl.
| | | |
|---|---|---|
| *B29C 70/88* | (2006.01) | |
| *B29C 71/02* | (2006.01) | |
| *B29C 71/04* | (2006.01) | |
| *B29D 11/00* | (2006.01) | |
| *H01L 25/16* | (2023.01) | |
| *H01L 33/56* | (2010.01) | |
| *B29C 45/00* | (2006.01) | |
| *B29C 45/14* | (2006.01) | |
| *B29K 63/00* | (2006.01) | |
| *B29L 31/34* | (2006.01) | |
| *H05K 3/28* | (2006.01) | |

(52) U.S. Cl.
CPC ...... *B29D 11/00807* (2013.01); *H01L 25/167* (2013.01); *B29C 2045/0075* (2013.01); *B29C 45/14065* (2013.01); *B29C 2045/14114* (2013.01); *B29C 45/14639* (2013.01); *B29C 2791/006* (2013.01); *B29K 2063/00* (2013.01); *B29L 2031/34* (2013.01); *B29L 2031/3425* (2013.01); *H01L 2933/005* (2013.01); *H05K 3/284* (2013.01)

(58) Field of Classification Search
CPC ......... B29C 45/34; B29C 70/88; B29C 71/02; B29C 71/04; B29C 2791/006; B29L 2031/3425; H05K 3/284
USPC ............ 264/272.13, 272.14, 272.15, 272.12, 264/331.12, 478; 438/127
See application file for complete search history.

(56) References Cited

U.S. PATENT DOCUMENTS

| | | |
|---|---|---|
| 2011/0285277 A1 | 11/2011 | Boerner |
| 2012/0098080 A1 | 4/2012 | Butterfield et al. |
| 2014/0183585 A1 | 7/2014 | Gubser et al. |
| 2014/0193950 A1 | 7/2014 | Chang et al. |
| 2015/0249065 A1 | 9/2015 | Pagaila |
| 2016/0218239 A1 | 7/2016 | Gubser et al. |
| 2018/0239116 A1 | 8/2018 | Yu et al. |
| 2021/0041650 A1* | 2/2021 | Yu .................. G02B 6/4249 |

FOREIGN PATENT DOCUMENTS

| | | | |
|---|---|---|---|
| CN | 108076671 A | | 5/2018 |
| JP | 0774194 A | * 3/1995 | ... H01L 2294/16225 |
| TW | 201038118 A | | 10/2010 |
| TW | 201 133 725 A | | 10/2011 |
| WO | 97/45242 A1 | | 12/1997 |
| WO | 2014/012603 A1 | | 1/2014 |
| WO | 2017/007425 A1 | | 1/2017 |
| WO | 2017/082820 A1 | | 5/2017 |
| WO | 2017/176213 A1 | | 10/2017 |

OTHER PUBLICATIONS

International Search Report with Written Opinion for related Application No. PCT/SG2019/050580 dated Feb. 26, 2020 (16 Pages).
Plumbridge et al., "Structural Integrity and Reliability in Electronics", May 8, 2007, book information retrieved from the internet, website:https://www.springer.com/gp/book/9781402017650, (3 Pages).
Singh et al., "Failure Modes and Mechanisms in Electronic Packages", Nov. 30, 1997, book information retrieved from the internet, website:https://www.springer.com/gp/book/9780412105913, (3 Pages).
Non-Final Office Action issued for Taiwan patent application No. 108144277, dated May 26, 2023, 5 pages (for informational purposes only).

\* cited by examiner

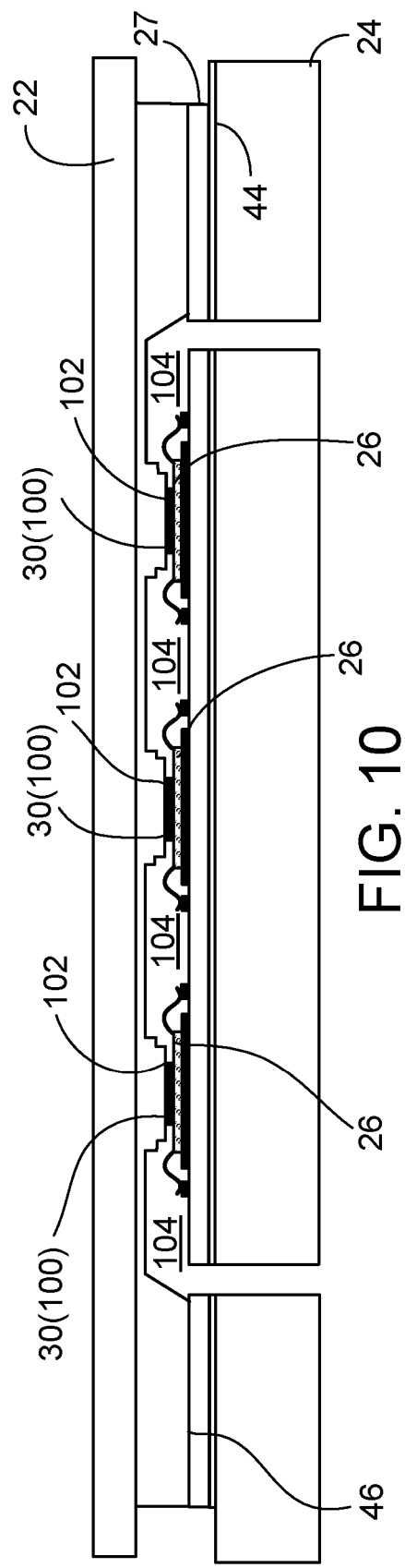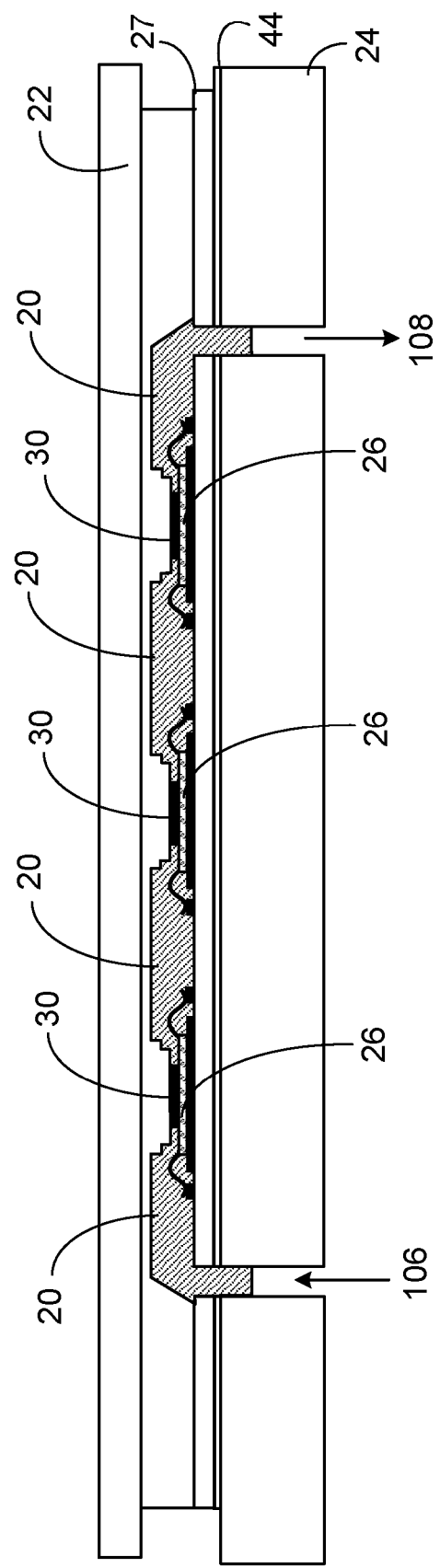

VACUUM INJECTION MOLDING FOR OPTOELECTRONIC MODULES

FIELD OF THE DISCLOSURE

The present disclosure relates to vacuum injection molding techniques for optoelectronic modules.

BACKGROUND

Various consumer electronic products and other host devices include compact optoelectronic modules that have integrated light sensing or light emitting devices. In some cases, the modules can be manufactured in a wafer-level process that allows multiple (e.g., tens, hundreds or even thousands) of modules to be fabricated in parallel at the same time. Replication techniques sometimes are used in these processes to facilitate formation of optical elements such as lenses. Likewise, vacuum injection techniques may be employed to facilitate formation of a housing or walls for the module. The replication and vacuum injection molding (VIM) techniques may be performed, for example, using polydimethylsiloxane (PDMS) or other tools that provide support during the fabrication process and/or that define the shape of the optical elements to be replicated. Typically, the process includes a lower tool and an upper tool.

A seal plate may be disposed between the upper and lower tools so as to establish a pre-defined distance between the tools when they are brought together for the replication and/or VIM processes. The use of a seal plate, however, may introduce greater variations in manufacturing tolerances for the module's dimensions. For example, use of a seal plate may increase the tolerance in the z-height (i.e., thickness) for the VIM material.

SUMMARY

The present disclosure describes processes for manufacturing optoelectronic modules that involve vacuum injection molding and, in some cases, can obviate the need for a seal plate and can reduce the variation in one or more tolerances.

For example, in one aspect, the disclosure describes a method that includes supporting a printed circuit board substrate on a first vacuum injection tool. The printed circuit board substrate has at least one optoelectronic component mounted thereon and has a solder mask on a surface facing away from the first vacuum injection tool. The method includes causing the first vacuum injection tool and a second vacuum injection tool to be brought closer to one another such that a surface of the second vacuum injection tool is in contact with the solder mask. Subsequently, a first epoxy is provided, using a vacuum injection technique, in spaces between the upper tool and the solder mask.

Some implementations include one or more of the following features. For example, the method can include replicating features of the second vacuum injection tool into a second epoxy to form a respective optical element over each of the at least one optoelectronic components. The replicating can occur, for example, as a result of causing the first vacuum injection tool and a second vacuum injection tool to be brought toward one another such that a surface of the second vacuum injection tool is in contact with the solder mask. In some instances, the second epoxy is transparent to a wavelength of light that the at least one optoelectronic component is operable to sense or emit. The first epoxy, however, may be non-transparent to the wavelength of light.

In some cases, causing the first and second vacuum injection tools to be brought toward one another includes causing a planar surface of the second vacuum injection tool that faces toward the first vacuum injection tool to be brought into contact with the solder mask.

In some implementations, the printed circuit board substrate covers an area of at least 0.4 times an area of the first vacuum injection tool on which the printed circuit board substrate is supported. The printed circuit board substrate can include an inlet hole through which the first epoxy flows during the vacuum injection technique. The printed circuit board substrate also can include an outlet hole through which some of the first epoxy flows during the vacuum injection technique. During performance of the vacuum injection technique, the inlet and outlet holes can be aligned, respectively, with corresponding inlet and outlet holes in the first vacuum tool. Also, during performance of the vacuum injection technique, the printed circuit board substrate can be attached to the first vacuum injection tool by a double-sided tape. The double-sided tape can have inlet and outlet holes such that, during performance of the vacuum injection technique, the inlet and outlet holes of the double-sided tape are aligned, respectively, with the inlet and outlet holes in the first vacuum tool and the inlet and outlet holes in the printed circuit board substrate.

In some instances, as a result of providing the first epoxy in the spaces between the upper tool and the solder mask, part of the first epoxy defines a baffle laterally surrounding a respective aperture for light to, or from, each of the at least one optoelectronic components to pass.

In some implementations, the second vacuum injection tool has a surface that defines outwardly-facing chamfered side edges for the first epoxy. The first vacuum injection tool can, in some cases, have a surface that is substantially square-shaped with chamfered corners.

In some cases, during performance of the vacuum injection technique, the printed circuit board substrate is surrounded laterally by a spacer. The spacer may have chamfered corners.

Other aspects, features and advantages will be readily apparent from the following detailed description, the accompanying drawings and the claims.

BRIEF DESCRIPTION OF THE DRAWINGS

FIGS. 8, 9, 10 and 11 illustrate various steps in a module fabrication process.

DETAILED DESCRIPTION

Figure 1:
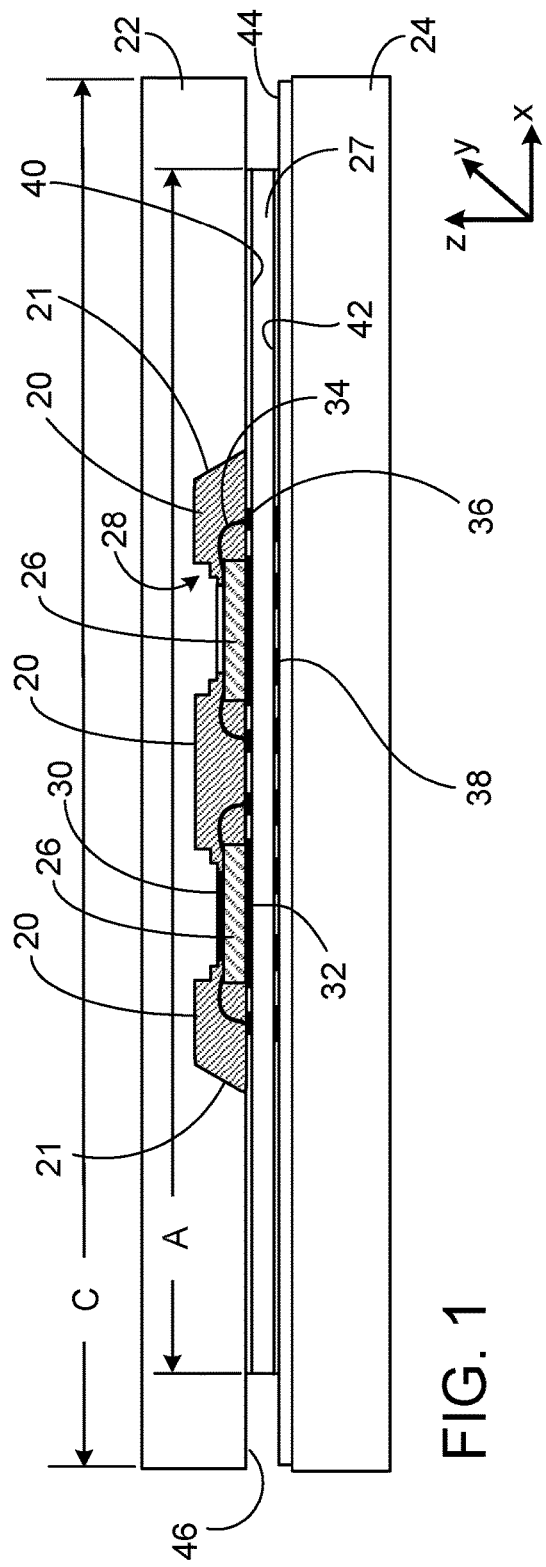
FIG. 1 illustrates a stage in a wafer-level process for fabricating optoelectronic modules.
Figure 2:
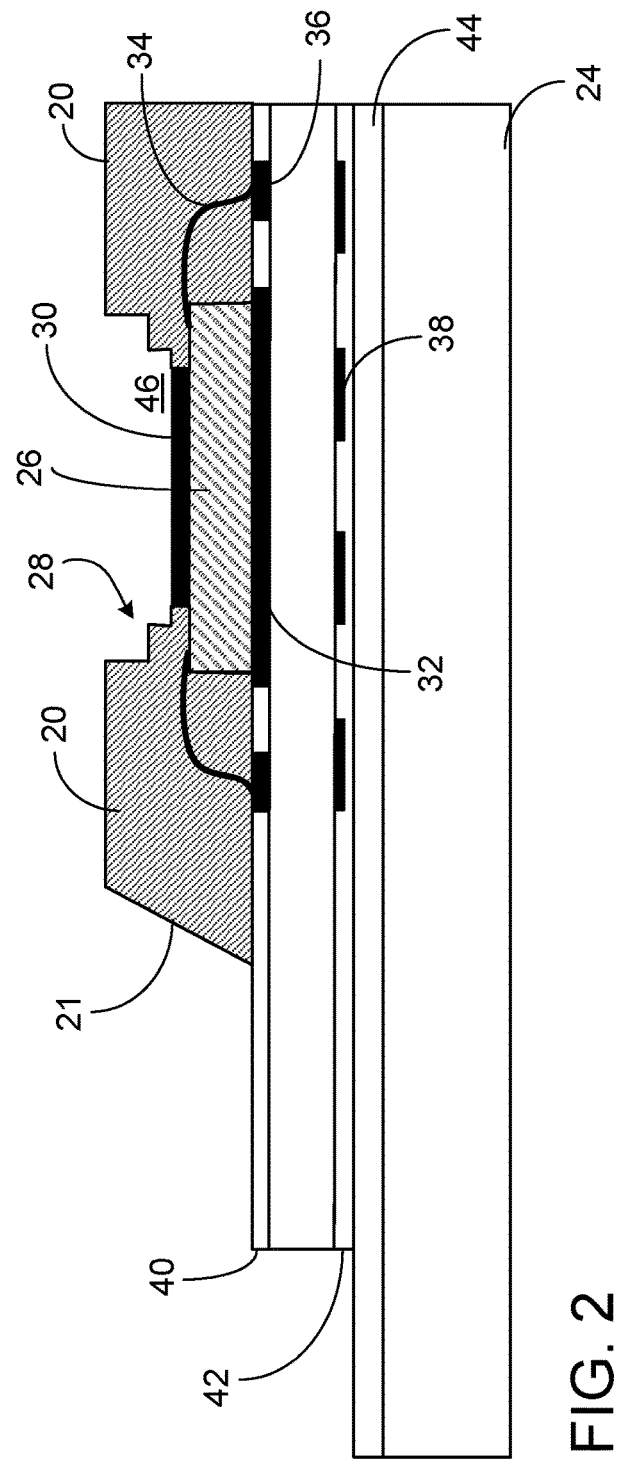
FIG. 2 illustrates an enlarged version of a portion of FIG. 1.

FIGS. 1 and 2 illustrate an intermediate stage in a wafer-level process for fabricating optoelectronic modules. As shown in FIGS. 1 and 2, a black or other epoxy 20 is injected between an upper injection tool 22 and a lower injection tool 24. The tools 22, 24 can be, for example, PDMS tools. The epoxy 20 laterally surrounds individual semiconductor device dies (e.g., photodetector chips or light emitting chips) 26 mounted to a printed circuit board (PCB) substrate 27. In the illustrated example, the epoxy 20 also defines a baffle 28, part of which laterally surrounds respective optical elements 30, such as a gird optics arrays, disposed on the dies 26. In the illustrated example, the shape of the baffle 28 and the shape of the optical elements 30 are defined (e.g., through a replication process) by the surface of the upper injection tool 24 that faces the PCB substrate 27. The optical elements 30 can be composed, for example, of a transparent epoxy (i.e., an epoxy that is transparent to a wavelength of light to be sensed or emitted by the chips 26).

The top and bottom surfaces of the PCB substrate 27 can have electrical contacts pads thereon. For example, electrical contacts on the bottom of each die 26 can be coupled electrically to the PCB substrate 27 by a respective surface mount technology (SMT) contact pad 32. Likewise, electrical contacts on the top of each die 26 can be coupled electrically to the PCB substrate 27 by respective wire bonds 34 that are connected to pads 36. SMT or other electrical contact pads 38 are provided on the bottom surface of the PCB substrate 27. Respective solder masks 40, 42 are provided over the top and bottom surfaces of the PCB substrate 27. For example, a solder mask can be present on the outer, non-active region of top surface of the PCG substrate. As further shown in FIGS. 1 and 2, double-sided tape 44 can be used to attach the PCB substrate 37 (by way of the lower solder mask 42) to the lower injection tool 24.

An aspect of the present disclosure is to make the x and y dimensions of the PCB substrate 27 sufficiently large so that the upper surface of the PCB substrate 27 (or, more specifically, the upper surface of the solder mask 40) defines a relative stop position for the upper and lower injection tools 22, 23 as they are moved toward one another during the fabrication process. For example, as illustrated in FIG. 1, the PCB substrate 27 extends along the x-axis well beyond the locations of the optoelectronic device dies 26 and well beyond the locations of the black epoxy 20. In particular, as explained in greater detail below, prior to injection of the black epoxy 20—and as part of the replication process for forming the optical elements 30—the upper and lower injection tools 22, 24 are moved toward one another until the lowermost surface 46 of the upper injection tool 22 contacts the opposing (i.e., upper) surface of the solder mask 40 on the PCB substrate 27. By making the lateral (i.e., x-y) dimensions of the PCB substrate 27 only somewhat smaller than the corresponding dimensions of the lower injection tool 24, the need for a seal plate can be eliminated. Further, in some cases, the foregoing arrangement can help reduce the variations in the manufacturing tolerances of the resulting modules. For example, variations in the z-height (i.e., thickness) for the VIM material 20 may be reduced. Further, in some instances, better control of the aperture 46 over the device 26 (see FIG. 2) can be obtained, which can result in improved functioning of the device 26.

Figure 3:
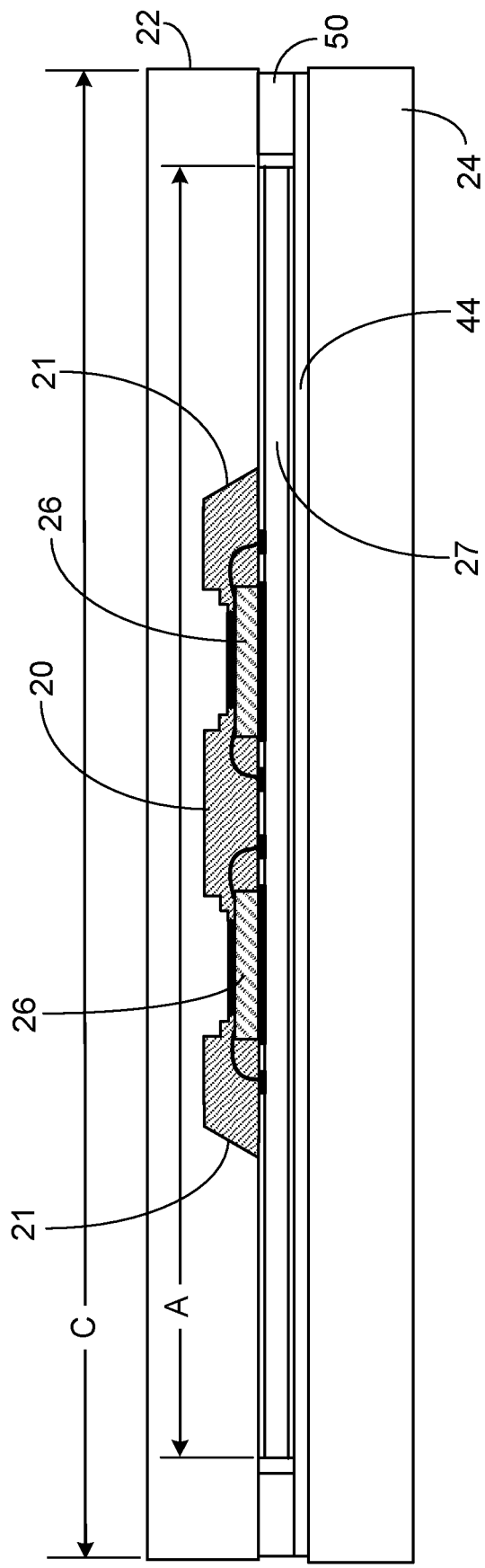
FIG. 3 illustrates an alternative embodiment that includes a spacer.
Figure 4:
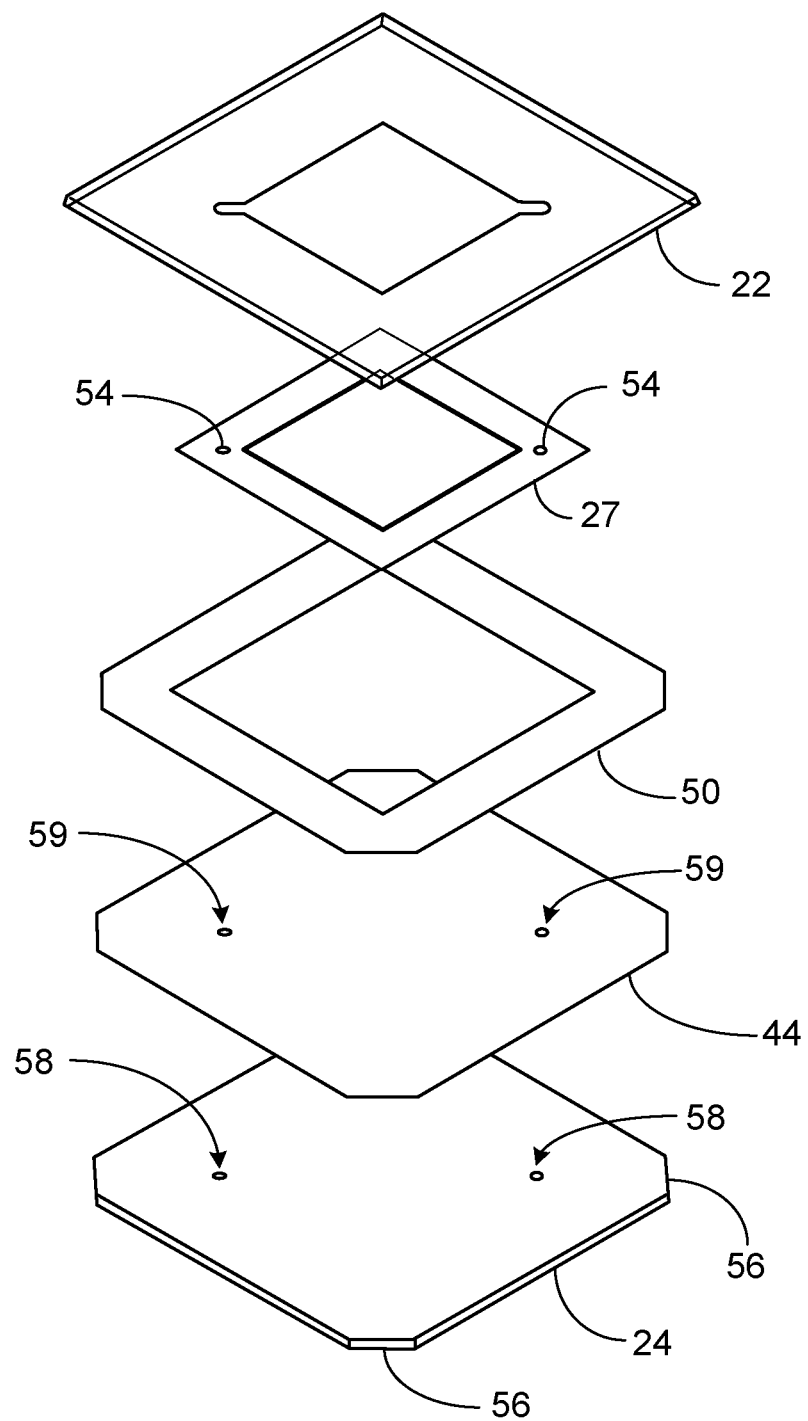
FIG. 4 is an exploded view showing various components of FIG. 3.

As shown in FIGS. 3 and 4, some implementations also include a spacer 50 that laterally surrounds the periphery of the PCB substrate 27. The spacer 50 should have substantially the same height as the PCB substrate 27 (including the thickness of the solder masks 40, 42). The spacer 50 can be composed, for example, of a resin or other material.

Figure 5:
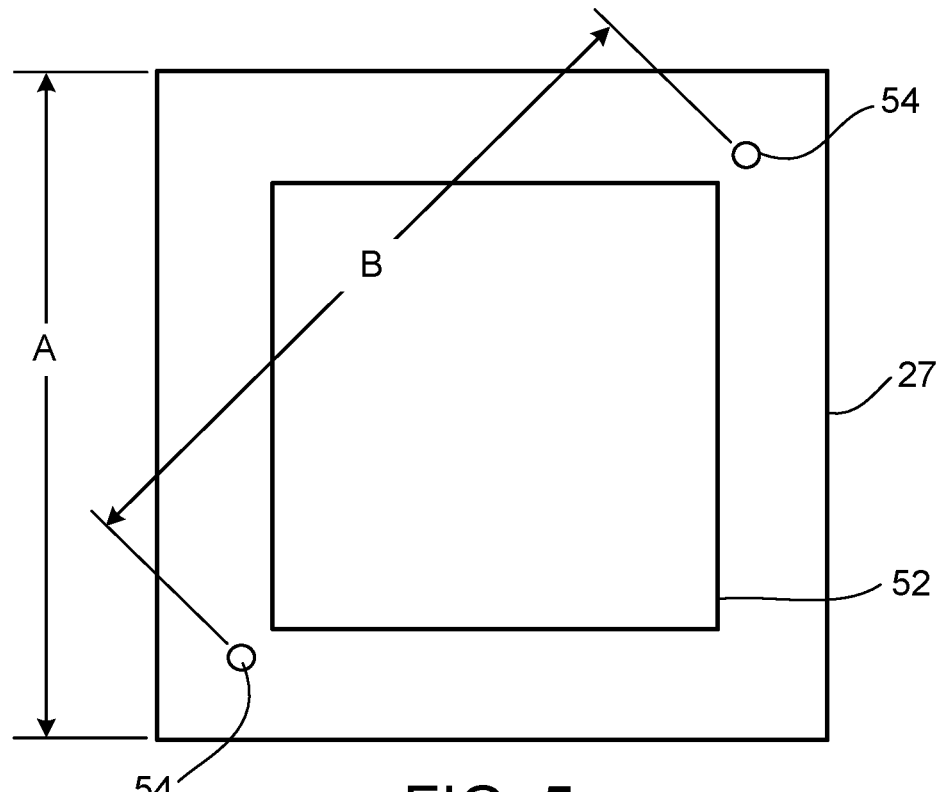
FIG. 5 is a top view of a PCB substrate.
Figure 6:
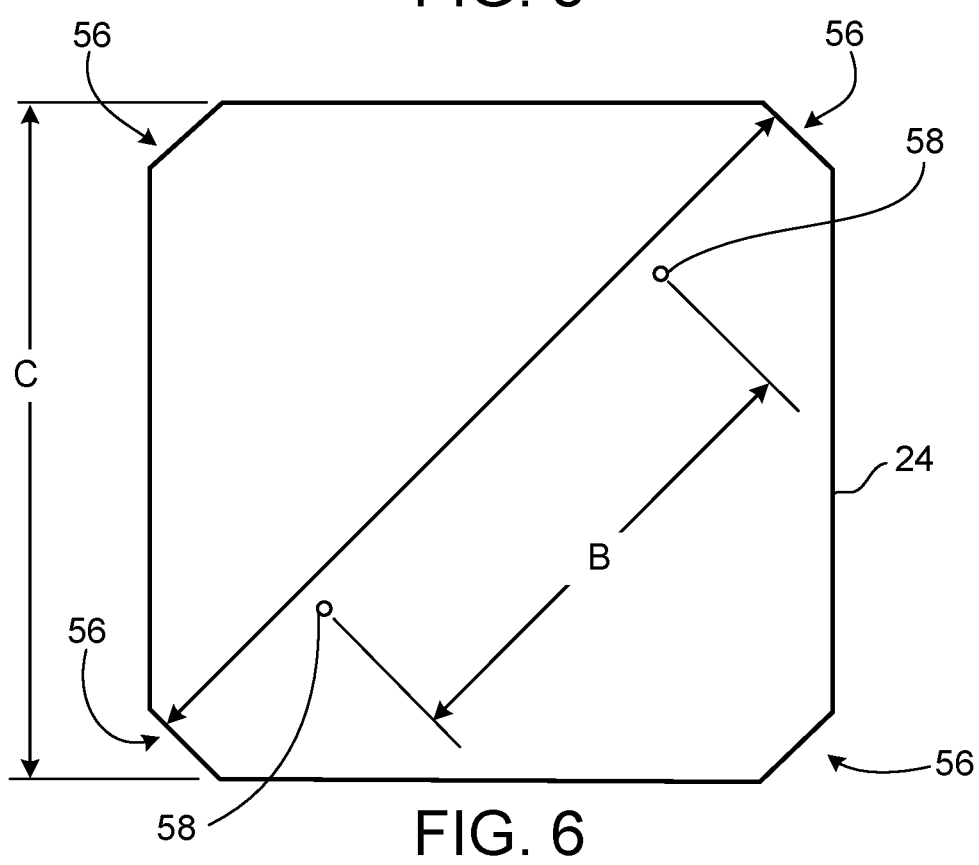
FIG. 6 is a top view of a lower injection tool.
Figure 7:
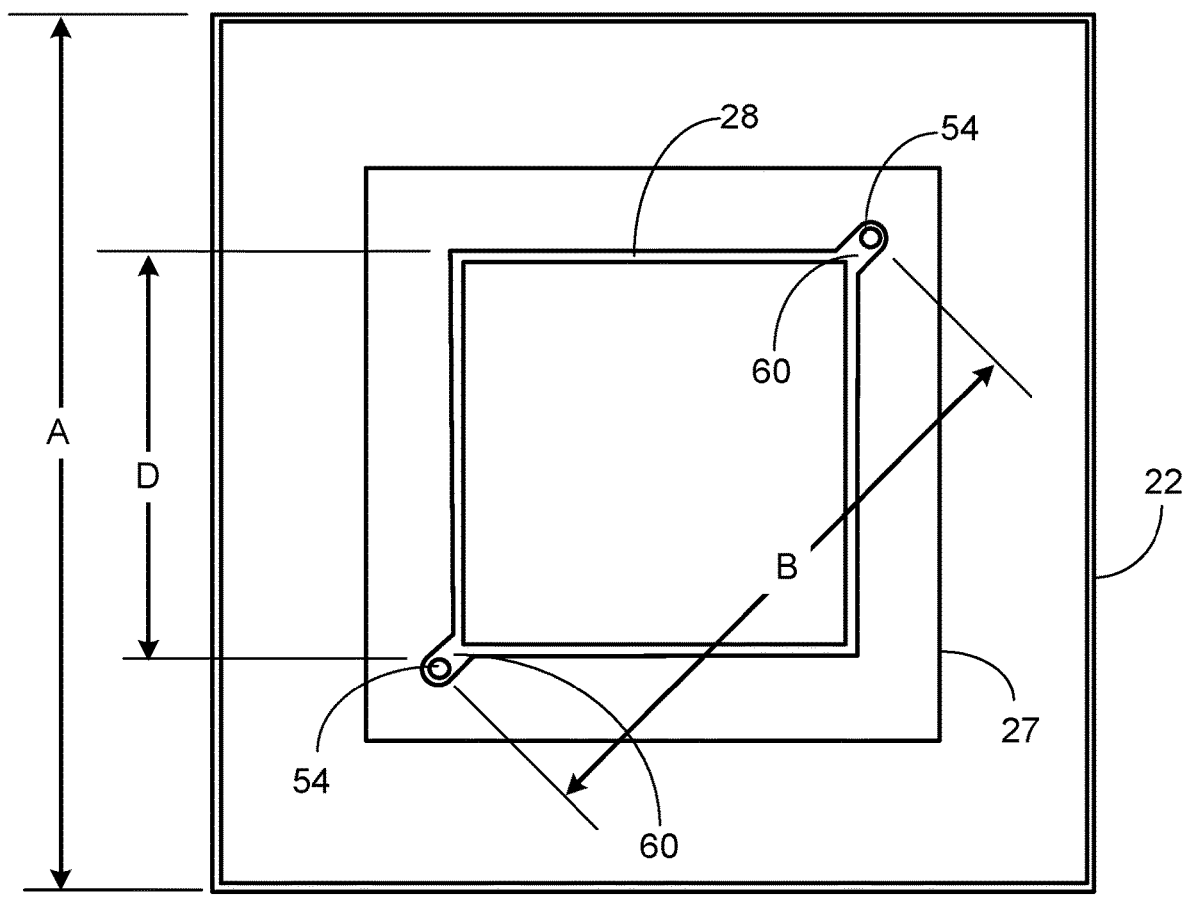
FIG. 7 is a top view of the upper injection tool.

FIGS. 5, 6 and 7 illustrate further details of the PCB substrate 27, the lower injection tool 24, and the upper injection tool 22, respectively, according to some implementations. For example, as shown in FIG. 5, the PCB substrate 27 has a square shape having a side dimension ('A') (e.g., 150 mm) and an active area 52 which, in the illustrated example, has dimensions 100 mm×100 mm. The PCB substrate 27 has holes 54 at opposite corners. The holes 54, which in the illustrated example are separated from one another by a distance ('B') of 160 mm, serve, respectively, as an inlet and outlet for the flow of epoxy 20 during the VIM process. Some or all of the foregoing details may differ for some implementations.

As further shown in FIG. 6, the lower injection tool 24 can have a surface that is substantially square-shaped with chamfered corners 56. The dimensions of the lower injection tool 24 as well as the presence of the chamfered corners 56 can be useful in some instances to allow the lower injection tool 24 to fit into other equipment for subsequent processing (e.g., a dicing machine). The double-sided tape 44 and the spacer 50, if present, can have outer side dimensions that are about the same as the lower tool 24, and also can have chamfered corners (see FIG. 4). In the illustrated example, the tool 24 has an outer side dimension ('C') of 9 inches (i.e., 228.6 mm), and a maximum diagonal distance from one corner 54 to another of 290 mm. Thus, for the illustrated example, the outer side dimension ('A') of the PCB substrate 27 is about two-thirds the size of the outer side dimension ('C') of the tool 24. Thus, in the depicted example, the PCB substrate 27 covers an area slightly more than 0.4 times an area of the first tool 24 on which the printed circuit board substrate is supported. The tool 24 also has holes 58 separated from one another by the distance B. These holes 58 also provide, respectively, the inlet and outlet for the flow of epoxy 20 during the VIM process and, thus, are aligned with the corresponding holes 54 in the PCB substrate 27. Likewise, the double-sided tape 44 includes inlet and outlet holes 59 aligned with the foregoing holes 58 of the tool 24 and the holes 54 of the PCB substrate 27 (see FIG. 4). Some or all of the foregoing details may differ for some implementations.

As further shown in FIG. 7, the upper injection tool 22 can be square-shaped with outer side dimensions ('A') the same as the corresponding outer side dimension of the lower injection tool 24 (e.g., 9 inch×9 inch, or 228.6 mm×228.6 mm) The inner dimension ('D') for the baffle 28 in the illustrated example is 106 mm. The upper injection tool 24 has slots 60 that overlap the positions of the inlet/outlet holes 54 in the PCB substrate 27. FIG. 7 also shows the position of the PCB substrate 27 below the upper injection tool 22. Some or all of the foregoing details may differ for some implementations.

Figure 8:
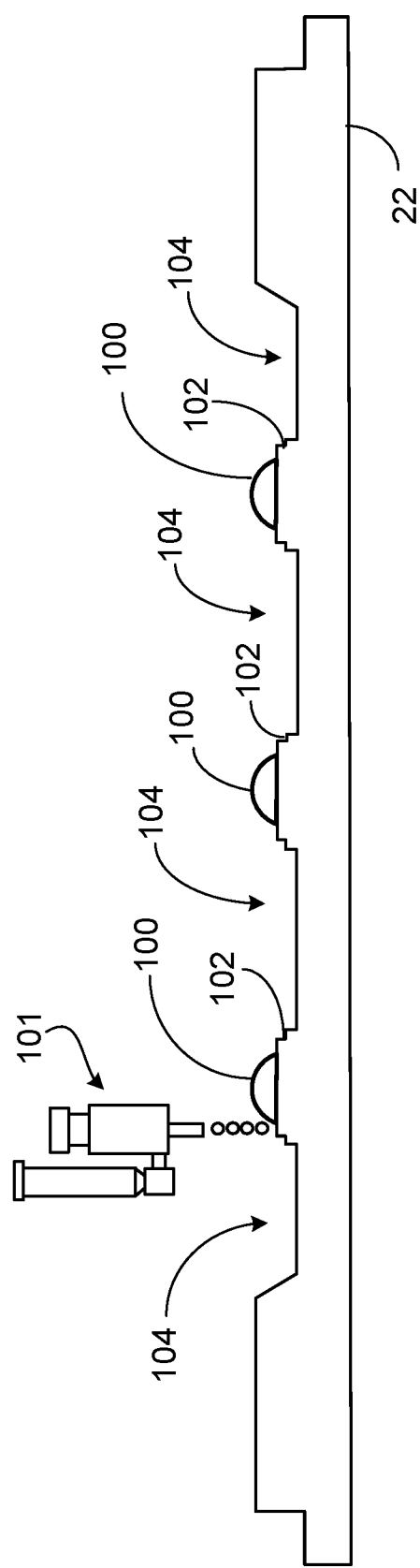

FIGS. 8, 9, 10 and 11 illustrate various steps in a wafer-level process for manufacturing optoelectronic modules as described above. As shown in FIG. 8, a transparent epoxy 100 is dispensed (e.g., by jetting equipment 101) onto the surface of the upper injection tool 22. The injection tool 22 includes features 102 that define the shape of the optical elements 30 that are formed in a subsequent operation. The injection tool 22 also includes spaces 104 that subsequently are filled by the injected black (non-transparent) epoxy.

Figure 9:
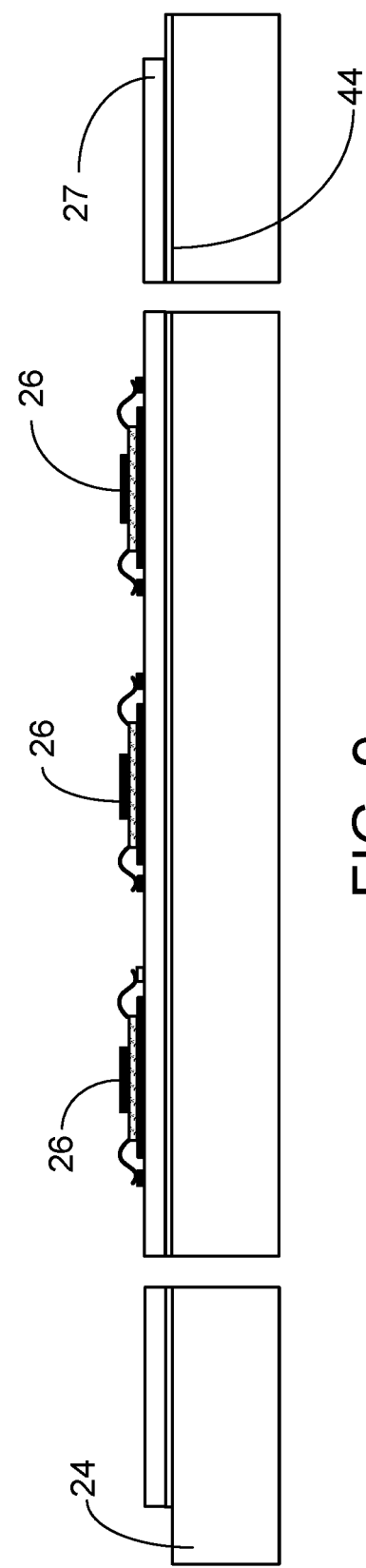

As shown in FIG. 9, optoelectronic devices 26 are mounted on the PCT substrate 27, which then is attached (e.g., by thermally releasable double-sided tape 44) to the lower injection tool 24.

As indicated by FIG. 10, the upper and lower injection tools 22, 24 are brought toward one another until the lowermost surface 46 of the upper tool 22 contacts the opposing (i.e., upper) surface of the solder mask on the PCB substrate 27. The surface 46 can be, for example, a planar surface that faces toward the first vacuum injection tool 24. To bring the upper and lower injections toward one another, either one (or both) of the tools 22, 24 may be moved relative to the other tool depending in the implementation. As a result of the surface 46 of the upper tool 22 contacting the opposing (i.e., upper) surface of the solder mask on the opposing surface of the PCB substrate 27, the features 102 of the upper tool 22 are replicated into the transparent epoxy 100. The epoxy 100 then can be hardened (e.g., by UV and/or thermal curing) to form the optical elements 30.

Next, as indicated by FIG. 11, the black or other non-transparent epoxy 20 is caused to flow through an inlet 106 so as to fill the spaces 104 between the upper tool 22 and the solder mask 40 on the PCB substrate 27. An outlet 108 is provided for the flow of any extra epoxy material 20. The epoxy 20 then can be hardened (e.g., by UV and/or thermal curing).

Following performance of the foregoing operations, the upper tool 22 can be removed, the resulting stack including the PCB substrate, can be singulated (e.g., by dicing), and the resulting individual modules can be removed from the tape 44.

The foregoing techniques can help reduce variations in the z-height tolerance. For example, the techniques can eliminate or reduce variations that otherwise may occur due to the use of a glass carrier, double-sided tape 44 and the PCB substrate 27. These affects can be achieved, at least in part, by using an arrangement in which upper tool 22 is brought into contact directly with PCB substrate 27 (or the surface of the solder mask 40 on the PCB substrate 27).

Further, for implementations in which a carrier glass is provided to support the PCB substrate 27, the carrier glass may be recycled readily for repeated use because little or no epoxy contacts the glass (other than, e.g., inlet and outlet holes for the flow of epoxy during the VIM process).

In some implementations, the inner surface of the upper tool 22 can be shaped so as to define chamfered outwardly-facing side edges 21 for the black epoxy 20 (see FIGS. 1-3). The chamfered side-edges 21 can facilitate removal of the upper tool 22 following curing of the injected epoxy.

Although the injected epoxy 20 may be referred to as black epoxy, more generally the epoxy 20 preferably is non-transparent to light of a wavelength sensed by, or emitted by, the optoelectronic devices 26 (e.g., photodetector chips or light emitting chips) mounted on the PCB substrate 27.

Various modifications will be readily apparent and can be made to the foregoing examples. Features described in connection with different embodiments may be incorporated into the same implementation in some cases, and various features described in connection with the foregoing examples may be omitted from some implementations. Thus, other implementations are within the scope of the claims.

What is claimed is:

1. A method comprising:
   supporting a printed circuit board substrate on a first vacuum injection tool, the printed circuit board substrate having at least one optoelectronic component mounted thereon and having a solder mask on a surface facing away from the first vacuum injection tool;
   causing the first vacuum injection tool and a second vacuum injection tool to be brought closer to one another such that a surface of the second vacuum injection tool is in contact with the solder mask; and
   subsequently providing a first epoxy, using a vacuum injection technique, in spaces between the second vacuum injection tool and the solder mask;
   wherein the printed circuit board substrate covers an area of at least 0.4 times an area of the first vacuum injection tool on which the printed circuit board substrate is supported; and
   wherein the printed circuit board substrate and the first vacuum injection tool have an x-dimension and a y-dimension and wherein each of the x-dimension and the y-dimension of the printed circuit board substrate is smaller than a corresponding x-dimension and y-dimension of the first vacuum injection tool.

2. The method of claim 1 including replicating features of the second vacuum injection tool into a second epoxy to form a respective optical element over each of the at least one optoelectronic components.

3. The method of claim 2 wherein the replicating occurs as a result of causing the first vacuum injection tool and a second vacuum injection tool to be brought toward one another such that a surface of the second vacuum injection tool is in contact with the solder mask.

4. The method of claim 2 wherein the second epoxy is transparent to a wavelength of light that the at least one optoelectronic component is operable to sense or emit.

5. The method of claim 2 wherein the first epoxy is non-transparent to the wavelength of light.

6. The method of claim 1 wherein causing the first and second vacuum injection tools to be brought toward one another includes causing a planar surface of the second vacuum injection tool that faces toward the first vacuum injection tool to be brought into contact with the solder mask.

7. The method of claim 1 wherein the printed circuit board substrate includes an inlet hole through which the first epoxy flows during the vacuum injection technique.

8. The method of claim 7 wherein the printed circuit board substrate includes an outlet hole through which some of the first epoxy flows during the vacuum injection technique.

9. The method of claim 8 wherein, during performance of the vacuum injection technique, the inlet and outlet holes are aligned, respectively, with corresponding inlet and outlet holes in the first vacuum tool.

10. The method of claim 9 wherein, during performance of the vacuum injection technique, the printed circuit board substrate is attached to the first vacuum injection tool by a double-sided tape.

11. The method of claim 10 wherein the double-sided tape has inlet and outlet holes, wherein, during performance of the vacuum injection technique, the inlet and outlet holes of the double-sided tape are aligned, respectively, with the inlet and outlet holes in the first vacuum tool and the inlet and outlet holes in the printed circuit board substrate.

12. The method of claim 1 wherein, as a result of providing the first epoxy in the spaces between the second vacuum injection tool and the solder mask, part of the first epoxy defines a baffle laterally surrounding a respective aperture for light to, or from, each of the at least one optoelectronic components to pass.

13. The method of claim 1 wherein the second vacuum injection tool has a surface that defines outwardly-facing chamfered side edges for the first epoxy.

14. The method of claim 1 wherein the first vacuum injection tool has a surface that is substantially square-shaped with chamfered corners.

15. The method of claim 1 wherein, during performance of the vacuum injection technique, the printed circuit board substrate is surrounded laterally by a spacer.

16. The method of claim 15 wherein the spacer has chamfered corners.

17. The method of claim 1 wherein each of an x-dimension and a y-dimension of the printed circuit board substrate is at least 10% smaller than corresponding x- and y-dimensions of the first vacuum injection tool.

18. The method of claim 1 wherein the printed circuit board substrate has a square shape having a side dimension A and the first vacuum injection tool has a square shape having a side dimension C, wherein the dimension A is two-thirds the size of dimension C.

19. The method of claim 1 wherein a carrier glass is provided to support the printed circuit board substrate.

* * * * *